United States Patent [19]

Veal et al.

[11] Patent Number: 5,611,854
[45] Date of Patent: Mar. 18, 1997

[54] SEED CRYSTALS WITH IMPROVED PROPERTIES FOR MELT PROCESSING SUPERCONDUCTORS FOR PRACTICAL APPLICATIONS

[75] Inventors: Boyd W. Veal; Arvydas Paulikas, both of Downers Grove; Uthamalingam Balachandran, Hinsdale; Wei Zhong, Chicago, all of Ill.

[73] Assignee: The University of Chicago, Chicago, Ill.

[21] Appl. No.: 531,399

[22] Filed: Sep. 21, 1995

[51] Int. Cl.$^6$ ............................................. C30B 11/04
[52] U.S. Cl. ...................... 117/1; 117/3; 117/4; 117/7; 117/9; 117/912; 117/937; 502/152
[58] Field of Search ............................ 117/1, 3, 4, 7, 117/9, 37, 41, 54, 64, 912, 937; 501/152

[56] References Cited

U.S. PATENT DOCUMENTS 5,217,944  6/1993  Tournier ....................... 117/37

Primary Examiner—R. Bruce Breneman
Assistant Examiner—Fehisa Garrett
Attorney, Agent, or Firm—Emrich & Dithmar

[57] ABSTRACT

A method of fabricating bulk superconducting material including $RBa_2Cu_3O_{7-\delta}$ comprising heating compressed powder oxides and/or carbonates of R and Ba and Cu present in mole ratios to form $RBa_2Cu_3O_{7-\delta}$ in physical contact with an oxide single crystal seed to a temperature sufficient to form a liquid phase in the $RBa_2Cu_3O_{7-\delta}$ while maintaining the single crystal seed solid to grow the superconducting material and thereafter cooling to provide a material including $RBa_2Cu_3O_{7-\delta}$. R is a rare earth or Y or La and the single crystal seed has a lattice mismatch with $RBa_2Cu_3O_{7-\delta}$ of less than about 2% at the growth temperature. The starting material may be such that the final product contains a minor amount of $R_2BaCuO_5$.

20 Claims, No Drawings

SEED CRYSTALS WITH IMPROVED PROPERTIES FOR MELT PROCESSING SUPERCONDUCTORS FOR PRACTICAL APPLICATIONS

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

This invention relates to a process of using "seed crystals" for growing single crystal or highly textured bulk quantities of superconductors such as large domain $RBa_2Cu_3O_{7-\delta}$ where R is a rare earth, La or Y. More specifically, the invention relates to melt processing high $T_c$ superconductors using seed crystals of lower cost oxide compounds such as, for instance, $SrTiO_3$, $LaAlO_3$, or the like, which have high melting or decomposition temperatures above those of the high $T_c$ superconductors but are readily available and of low cost and which are not Tc superconductors themselves.

Large domains of $YBa_2Cu_3O_8$ materials show high levitation forces because of their size and because of their good flux-pinning strength due to large numbers of small pinning sites. The materials show promise in practical applications requiring levitation or high magnetic fields, such as fly wheels for energy storage, high field magnets, magnetic resonance imaging and efficient electric generators. Previously, $SmBa_2Cu_3O_x$ as well as $Nd_{1+x}Ba_{2-x}Cu_3O_y$ have been used as the seeding material during the melt-growth process in making large single domain 123 material ($YBa_2Cu_3O_x$).

More particularly, $SmBa_2Cu_3O_x$ (Sm 123) had been used, but this material has a serious defect in that Sm 123 has only a slightly higher melting point than the bulk (YBCO) 123 material and, therefore, the seeds of Sm 123 often melt during the process. This is undesirable, since the purpose of the seeding material is to provide solid particles to facilitate the crystallization of the melted 123 material during the melt-forming process.

It has been found that Nd 123 forms a solid solution in the form of $Nd_{1+x}Ba_{2-x}Cu_3O_y$ and was previously thought to be unsatisfactory as a seed material, but a co-pending patent application Ser. No. 371,931 filed Jan. 12, 1995, assigned to the assignee herein, the disclosure of which is herein incorporated by reference, teaches the use of the Nd 123 material as a seed for preparing bulk superconducting material.

The problem encountered in using either the Sm or Nd 123 materials as seeds is that both of these materials are expensive even though the Nd 123 material is particularly advantageous because of its relatively high melting temperature compared to the melting temperature of bulk superconductor being prepared so that the Nd 123 material does not melt during the high temperature processing of the $RBa_2Cu_3O_x$ material.

It has been found that suitable inexpensive seed materials exist which have crystallographic structures and lattice parameters sufficiently close to $RBa_2Cu_3O_{7-\delta}$ such that large domain material can be prepared by using the cheaper oxides as templates with respect to particular superconductors. The advantage of the present invention is that the crystals of special interest are available commercially and are of relatively low cost.

SUMMARY OF THE INVENTION

Accordingly, an object of the present invention is to provide a method of making large single domain 123 material by the use of relatively inexpensive, commercially available oxide materials.

Another object of the invention is to provide a method of making single domain or highly textured bulk quantities of superconductors using a seed crystal which is a commercially available oxide wherein the seed crystal has a lattice mismatch with the 123 high $T_c$ superconductor of less than about 2% at the growth temperature.

The invention consists of certain novel features hereinafter fully described and particularly pointed out in the appended claims, it being understood that various changes in the details may be made without departing from the spirit, or sacrificing any of the advantages of the present invention.

DESCRIPTION OF THE PREFERRED EMBODIMENT

Our invention consists of the use of commercially available single crystal inexpensive materials as seeds for melt-processing textured high temperature superconductors. $SrTiO_3$, $LaAlO_3$ and cubic stabilized $ZrO_2$ (i.e. $ZrO_2$ containing a divalent or trivalent dopant such as Ca or Y to stabilize the cubic phase) is acceptable. The seed crystal is used as a nucleation center for growing single crystals (or textured material) of $RBa_2Cu_3O_{7-\delta}$ (RBCO) of larger size than the seed. It is necessary that the crystallographic structures of the seed crystal surface be sufficiently similar to an RBCO growth face so that the epitaxial growth process of the RBCO will occur with nucleation beginning at the seed. In addition to a suitable lattice parameter match between the seed and the RBCO, it is necessary that "wetting" of the seed by the liquid (slurry) RBCO will occur prior to nucleation.

For YBCO, growth and texturing occurs at approximately 1000° C., where YBCO has the tetragonal structure with a-axis lattice parameter 3.904 Å (in air). It is desirable that the seed material be cubic or tetragonal with an a-axis parameter near 3.9 Å at 1000° C., or orthorhombic with a, b parameters, both of which are close to 3.9 Å at 1000° C. It is desirable for the purposes of this invention that the lattice mismatch be within one to two percent at the growth temperature. Accordingly, the requirements for the seeding material of the present invention are that the lattice mismatch at growth temperature is not greater than two percent at the growth temperature, that the seed material have a melting or decomposition temperature in excess of the high temperature RBCO material being manufactured and that the liquid phase of the RBCO will effectively wet the seed material prior to nucleation.

Materials which have suitable characteristics as seed materials according to the invention are set forth in the table below.

| Seed Material | Crystal Symmetry | Lattice Pars. @ 20° C. (in Å) | Pars. @ 1000° C. (in Å) | Mismatch |
|---|---|---|---|---|
| $SrTiO_3$ | cubic | 3.904 | 3.938 | <1% |
| $LaAlO_3$ | rhombohedral (RT) | 3.788 | 3.826 | 1.9% |
| $PbTiO_3$ | tetragonal | 3.896 Å | | <1% |
| $Sr_2RuO_4$ | tetragonal | 3.87 Å | | <1% |

-continued

| Seed Material | Crystal Symmetry | Lattice Pars. @ 20° C. (in Å) | Pars. @ 1000° C. (in Å) | Mismatch |
|---|---|---|---|---|
| NdGaO$_3$ | Orthorhombic | a = 5.426, b = 5.502 | | both a and b, <1% |
| LaCrO$_3$ | Orthorhombic | a = 5.477, b = 5.514 | | both a and b, <1% |
| NdCrO$_3$ | Orthorhombic | a = 5.412, b = 5.494 | | maximum mismatch −1% |
| LaFeO$_3$ | Orthorhombic | a = 5.556, b = 5.514 | | maximum mismatch −1.6% |
| NdFeO$_3$ | Orthorhombic | a = 5.441, b = 5.573 | | maximum mismatch −2% |
| La$_2$CuO$_4$ | Orthorhombic | 3.80 | | <1% |

Although PbTiO$_3$ is shown in the Table, other perovskites of the form RTiO$_3$, when R is La or a rare earth are good candidates. EuTiO$_3$ has a lattice parameter of 3,897 Å. NdGaO$_3$, and other perovskite-like oxides with the prototype GdFeO$_3$ structure should also serve well. NdGaO$_3$ is available as a commercial substrate material. Others may also be commercially available, particularly LaCrO$_3$ which has many industrial applications.

Oxides with the GdFeO$_3$ (ABO$_3$) structure are similar to the perovskites and can be viewed as an assembly of four perovskite cells each of which has a small distortion from the cubic structure.

To serve as epitaxial YBCO substrate, the relevant distance in the GdFeO$_3$ structure is twice the B-ion to oxygen distance. (The a-parameter in tetragonal YBCO is twice the Cu-O distance.) The GdFeO$_3$ structure is indexed such that the cell edge is rotated 45° relative to the B-O direction. An ideal GdFeO$_3$-type substrate would have 2(B-O) distance= 3.87 Å (allowing 0.03 Å for thermal expansion, or 3.90 Å at 1000° C.). Thus, a GdFeO$_3$ structure should have room temperature a-b lattice parameters close to 5.47 Å (1.414× 3.87 Å). Potentially useful seed materials with the GdFeO$_3$ structure are listed in the above Table.

Textured materials were prepared starting with powders of Y$_2$O$_3$, BaCO$_3$ and CuO. The starting powders were mixed to yield stoichiometric compositions of YBa$_2$Cu$_{O7-\delta}$ and calcined at 900° C. at reduced oxygen partial pressure for 12 hours. The materials may also be carbonates as taught in the application referenced above. The calcined powder was then sieved and mixed with 20 mole % commercial Y$_2$BaCuO$_5$ powder by ball milling. The mixed powder was compacted into hexagon pellets under the applied pressure of 13 MPa. Various amounts of Y$_2$BaCuO$_5$ may be advantageously utilized, preferably between about 5 and 25 mole percent.

For the melt processing, a small single crystal seed was placed on the top of each hexagonal pellet to induce oriented crystallization in a temperature gradient in the furnace. The hexagonal samples with the seed crystal on the top were then put into a furnace with a temperature gradient about 10° C./cm and partially melted at 1065° C. for 20 minutes; cooled to 1025° C. at a rate of 60° C/hour; then cooled to 920° C. at a slow rate of 1° C./hour; and then cooled to room temperature at a rate of 60° C./hour. The melt processed samples were then oxygenated at approximately 500° C. for about 150 hours in ambient pressure oxygen gas.

The levitation forces were measured by using a small permanent magnet that is attached to the end of a cantilevered beam and suspended over a superconductor. The support end of the beam is connected to micrometer stages capable of horizontal and vertical position adjustments. The position of the beam is monitored by an optical tracking camera that focuses on a target that is fixed to the beam above the position of the permanent magnet. The camera is capable of resolving position to 0.25 microns. The deflection of the beam is correlated to the force on the magnet. Periodically, the apparatus is calibrated by hanging known weights on the beam at the location where the magnet is attached. The levitation force as a function of height is then determined by moving the magnet toward the superconductor and noting the beam deflection, and using the correlation to determine the force. The magnetic levitation pressure is determined by dividing the force by the area of the magnet on its lower pole face. Levitation forces of melt processed superconductors made using SrTiO$_3$ and LaAlO$_3$ seeds were comparable to or exceeded the levitation forces of melt-processed samples prepared with previously known seeding material such as SmBa$_2$Cu$_3$O$_{7-\delta}$ and NdBa$_2$Cu$_3$O$_{7-\delta}$.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as followed:

1. A method of fabricating a bulk superconducting material including RBa$_2$Cu$_x$O$_3$ comprising heating compressed power oxides and/or carbonates of R and Ba Cu present in mole ratios to form RBa$_2$Cu$_3$O$_x$ in physical contact with an oxide single crystal seed temperature at which a liquid phase in the RBa$_2$Cu$_3$O$_x$ is formed while maintaining the single crystal seed solid to grow the superconducting material and thereafter cooling to provide a material including RBa$_2$Cu$_3$O$_x$, R being Y or La and said single crystal seed having a lattice mismatch with RBa$_2$Cu$_3$O$_x$ of less than about 2% at the growth temperature.

2. The method of claim 1, wherein an amount of R$_2$BaCuO$_5$ is present in the compress power oxides or carbonates less than 50 mole percent.

3. The method of claim 2, wherein the R$_2$BaCuO$_5$ is present in an amount in the range of from about 5 to 25 mole percent.

4. The method of claim 1, wherein said single crystal seed is cubic or tetragonal.

5. The method of claim 1, wherein the R is Y having a tetragonal crystal structure with an a-axis lattice parameter of about 3.904 in air at 1000° C.

6. The method of claim 5, wherein said single crystal seed is cubic or tetragonal with a lattice mismatch of the a-axis of not more than 2% at 1000° C.

7. The method of claim 5, wherein said single crystal seed is one or more of SrTiO$_3$, LaAlO$_3$ Sr$_2$RuO$_4$, La$_2$CuO$_4$ and RTiO$_3$ where R is La or Pb or a rare earth.

8. The method of claim 1, wherein said single crystal seed is one or more of SrTiO$_3$, LaAlO$_3$, Sr$_2$RuO$_4$, La$_2$CuO$_3$ and RTiO$_3$ where R is La or Pb or a rare earth.

9. The method of claim 1, wherein said single crystal seed is one or more of NdGaO$_3$, LaCrO$_3$, NdCrO$_3$, LaFeO$_3$, and NdFeO$_3$.

10. The method of claim 1, wherein said single crystal seed is cubic, tetragonal or orthorhombic.

11. A method of fabricating a bulk superconductor material including RBa$_2$Cu$_3$O$_{7-\delta}$ and a minor amount of R$_2$BaCuO$_5$ comprising heating powder oxides of RBa$_2$Cu$_3$O$_{7-\delta}$ and a minor amount of R2BaCuO5 or oxides and/or carbonates of R and Ba and Cu present in mole ratios to form $RBa_2Cu_3O_{7-\delta}$ and $R_2BaCuO_5$ in physical contact with an oxide single crystal seed to a temperature sufficient to form a liquid phase in the $RBa_2Cu_3O_x$ while maintaining the single crystal seed solid to grow the superconducting material and thereafter cooling to provide a material including $RBa_2Cu_3O_x$ and $R_2BaCuO_5$, R being a rare earth or Y or La and said single crystal seed having a lattice mismatch with $RBa_2Cu_3O_{x7-\delta}$ of less than about 2% of the a-axis at the growth temperature.

12. The method of claim 11, wherein said $R_2BaCuO_5$ is present in an amount in the range of from about 5 mole percent to about 25 mole percent.

13. The method of claim 11, wherein said single crystal seed is cubic or tetragonal or orthorhombic.

14. The method of claim 13, wherein said single crystal seed is one or more of $SrTiO_3$, $LaAlO_3$, $Sr_2RuO_4$, $La_2CuO_4$ and $RTiO_3$ where R is La or Pb or a rare earth.

15. The method of claim 14, wherein said $R_2BaCuO_5$ is present in an amount not less than about 20 mole percent.

16. The method of claim 15, wherein $RBa_2Cu_3O_{7-\delta}$ is $YBa_2Cu_3O_{7-\delta}$ and the $R_2BaCuO_5$ is $Y_2BaCuO_5$.

17. The method of claim 13, wherein said single crystal seed is one or more of $Sr_2RuO_4$, $La_2CuO_4$, $NdGaO_3$, $LaCrO_3$, $NdCrO_3$, $LaFeO_3$ and $NdFeO_3$.

18. The method of claim 17, wherein said $R_2BaCuO_5$ is present in an amount not less than about 20 mole percent.

19. The method of claim 18, wherein the $RBa_2Cu_3O_x$ is $YBa_2Cu_3O_x$ and the $R_2BaCuO_5$ is $Y_2BaCuO_5$.

20. The method of claim 19, wherein the seed crystal $RTiO_3$ is $EuTiO_3$.

* * * * *

UNITED STATES PATENT AND TRADEMARK OFFICE
CERTIFICATE OF CORRECTION

PATENT NO. : 5,611,854
DATED : March 18, 1997
INVENTOR(S) : BOYD W. VEAL, ET AL.

It is certified that error appears in the above-indentified patent and that said Letters Patent is hereby corrected as shown below:

Claim 1, line 28, delete $RBa_2Cu_xO_3$ and insert --$RBa_2Cu_3O_x$--.

Claim 1, line 29, "power" should be --powder--.

Claim 1, line 31, after the word "seed" insert --to a--.

Claim 2, line 39, delete "compress power" and insert --compressed powder--.

Claim 15, line 1, delete "15" and insert --14--.

Claim 19, line 11, delete "17" and insert --18--.

Signed and Sealed this

Second Day of September, 1997

*Attest:*

BRUCE LEHMAN

*Attesting Officer*   Commissioner of Patents and Trademarks